(12) United States Patent
Chakravarti et al.

(10) Patent No.: US 8,053,317 B2
(45) Date of Patent: Nov. 8, 2011

(54) METHOD AND STRUCTURE FOR IMPROVING UNIFORMITY OF PASSIVE DEVICES IN METAL GATE TECHNOLOGY

(75) Inventors: Satya N. Chakravarti, Hopewell Junction, NY (US); Dechao Guo, Wappingers Falls, NY (US); Wilfried Ernst-August Haensch, Somers, NY (US); Pranita Kulkarni, Albany, NY (US); Fei Liu, Mt. Kisco, NY (US); Philip J. Oldiges, Lagrangeville, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 12/541,933

(22) Filed: Aug. 15, 2009

(65) Prior Publication Data

US 2011/0037128 A1 Feb. 17, 2011

(51) Int. Cl.
 *H01L 21/8234* (2006.01)
(52) U.S. Cl. ........ 438/275; 438/239; 438/241; 438/257; 438/278; 438/300; 257/213; 257/288; 257/292; 257/306; 257/321; 257/E21.645
(58) Field of Classification Search ................... None
 See application file for complete search history.

(56) References Cited

U.S. PATENT DOCUMENTS

| | | | |
|---|---|---|---|
| 5,465,005 A | 11/1995 | Eklund et al. | |
| 7,112,535 B2 | 9/2006 | Coolbaugh et al. | |
| 7,242,072 B2 | 7/2007 | Kothandaraman et al. | |
| 7,288,804 B2 | 10/2007 | Booth, Jr. et al. | |
| 7,334,320 B2 | 2/2008 | Voldman | |
| 2005/0104108 A1* | 5/2005 | Hong | 257/298 |
| 2007/0093015 A1 | 4/2007 | Kudo et al. | |
| 2007/0096183 A1 | 5/2007 | Ogawa et al. | |
| 2007/0215944 A1 | 9/2007 | Komatsu | |
| 2008/0258232 A1 | 10/2008 | Mizumura | |

* cited by examiner

*Primary Examiner* — N Drew Richards
*Assistant Examiner* — Kyoung Lee
(74) *Attorney, Agent, or Firm* — Law Offices of Ira D. Blecker, PC

(57) ABSTRACT

Method of forming a semiconductor device which includes the steps of obtaining a semiconductor substrate having a logic region and an STI region; sequentially depositing layers of high K material, metal gate, first silicon and hardmask; removing the hardmask and first silicon layers from the logic region; applying a second layer of silicon on the semiconductor substrate such that the logic region has layers of high K material, metal gate and second silicon and the STI region has layers of high K material, metal gate, first silicon, hardmask and second silicon. There may also be a second hardmask layer between the metal gate layer and the first silicon layer in the STI region. There may also be a hardmask layer between the metal gate layer and the first silicon layer in the STI region but no hardmask layer between the first and second layers of silicon in the STI region.

25 Claims, 6 Drawing Sheets

METHOD AND STRUCTURE FOR IMPROVING UNIFORMITY OF PASSIVE DEVICES IN METAL GATE TECHNOLOGY

BACKGROUND OF THE INVENTION

The present invention relates in general to methods of fabrication and semiconductor structures, and more particularly, to methods of fabrication and semiconductor structures in high dielectric constant (high K), metal gate technology relating to resistors and electrically programmable fuses (e-fuses).

The standard materials for semiconductors have been silicon dioxide as a gate oxide and polysilicon as the gate electrode. To fabricate semiconductors at the 45 nanometer (nm) node, advanced technology processes use high k dielectric materials for the gate dielectric layer along with metals other than polysilicon for the gate electrode. Such devices may be referred to as high k/metal gate (HKMG) semiconductors. The high k gate dielectric layer is generally deposited directly on a silicon substrate and a metal gate electrode is formed on the high k gate dielectric layer. As transistors have decreased in size, the thickness of the silicon dioxide gate dielectric has steadily decreased. However, with the thinning of the silicon dioxide comes the problem of leakage currents due to tunneling through the silicon dioxide. Replacing the silicon dioxide dielectric with a high K material reduces leakage effects. Metal gates are used for increased conductivity.

With HKMG technology, the passive devices (resistor and e-fuse) have a metal layer and a silicon stack. Due to the high conductivity of the metal underneath the silicon stack, the resistance has been lower than the required target. In one proposed manufacturing method, the silicon stack on the passive device side is thinner than on the active device side which could cause the passive device to work improperly. As the gate height is scaled to reduce the gate to contact array overlap capacitance, this problem could worsen.

Accordingly, it is a purpose of the present invention to have a method of fabrication and structure for a HKMG technology device in which the silicon stack on the passive device is of sufficient thickness so that the passive device operates properly.

BRIEF SUMMARY OF THE INVENTION

The various advantages and purposes of the present invention as described above and hereafter are achieved by providing, according to a first aspect of the invention, a method of forming a semiconductor device comprising the steps of:
   obtaining a semiconductor substrate having a logic region and a shallow trench isolation (STI) region;
   sequentially depositing layers of a high dielectric constant (high K) material, a metal gate, a first silicon and a hardmask on the semiconductor substrate to form a semiconductor substrate having layers of high dielectric constant (high K) material, metal gate, first silicon and hardmask;
   removing the hardmask and first silicon layers from the logic region of the semiconductor substrate to result in a semiconductor substrate having a logic region having layers of high K material and metal gate and an STI region having layers of high K material, metal gate, first silicon and a hardmask; and
   applying a second layer of silicon on the semiconductor substrate such that the logic region comprises layers of high K material, metal gate and second silicon and the STI region comprises layers of high K material, metal gate, first silicon, hardmask and second silicon.

According to a second aspect of the invention, there is provided a method of forming a semiconductor device comprising the steps of:
   obtaining a semiconductor substrate having a logic region and a shallow trench isolation (STI) region;
   sequentially depositing layers of a high dielectric constant (high K) material, a metal gate, a first hardmask, a first silicon and a second hardmask on the semiconductor substrate to form a semiconductor substrate having layers of high dielectric constant (high K) material, metal gate, first hardmask, first silicon and second hardmask;
   removing the second hardmask, first silicon and first hardmask layers from the logic region of the semiconductor substrate to result in a semiconductor substrate having a logic region having layers of high K material and metal gate and an STI region having layers of high K material, metal gate, first hardmask, first silicon and second hardmask; and
   applying a second layer of silicon on the semiconductor substrate such that the logic region comprises layers of high K material, metal gate and second silicon and the STI region comprises layers of high K material, metal gate, first hardmask, first silicon, second hardmask and second silicon.

According to a third aspect of the invention, there is provided a semiconductor structure comprising:
   a semiconductor substrate having a logic region and a shallow trench isolation (STI) region;
   the logic region having, in the following order, a layer of high dielectric constant (high K) material, a metal gate layer and a silicon layer;
   the STI region having, in the following order, a layer of high K material, a metal gate layer, a first silicon layer, a hard mask layer and a second silicon layer;
   wherein the silicon layer in the logic region has a first thickness and the second silicon layer in the STI region has a second thickness wherein the first thickness equals the second thickness.

According to a fourth aspect of the invention, there is provided a semiconductor structure comprising:
   a semiconductor substrate having a logic region and a shallow trench isolation (STI) region;
   the logic region having, in the following order, a layer of high dielectric constant (high K) material, a metal gate layer and a silicon layer;
   the STI region having, in the following order, a layer of high K material, a metal gate layer, a first hardmask layer, a first silicon layer, and a second silicon layer;
   wherein the silicon layer in the logic region has a first thickness and the second silicon layer in the STI region has a second thickness wherein the first thickness equals the second thickness.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
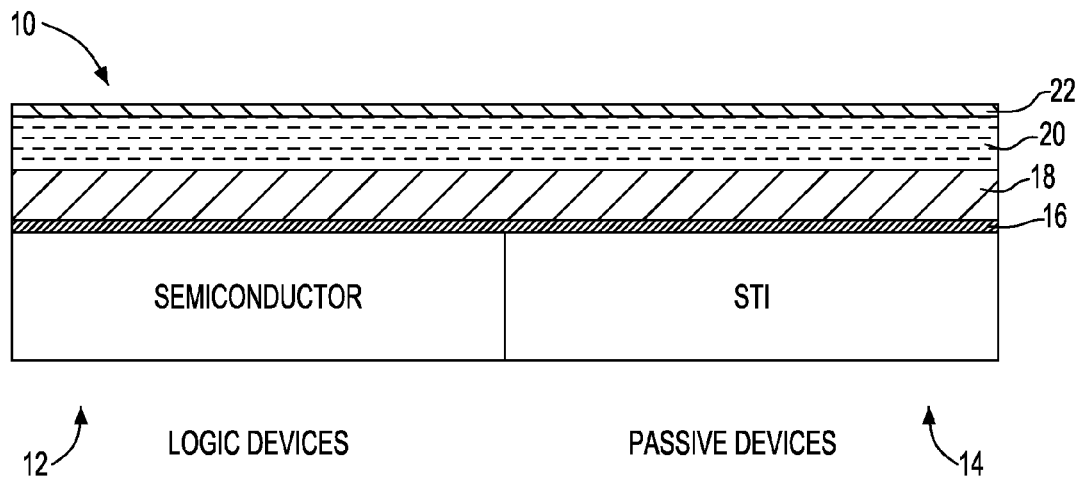
FIGS. 1 to 5 illustrate a method of fabrication and a structure of a first embodiment of a HKMG semiconductor according to the present invention having improved silicon thickness on the passive device.

Referring to the Figures in more detail, and particularly referring to FIGS. 1 to 5, there is shown a method of fabrication and a structure of a first embodiment of a HKMG semiconductor according to the present invention having improved silicon thickness on the passive device. As shown in FIG. 1, there is a partially fabricated semiconductor 10 on a semiconductor wafer having at least one logic region 12 made from a semiconductor material upon which the logic device will be fabricated and at least one shallow trench isolation (STI) region 14 made from an insulating material, such as an oxide, upon which the passive device will be fabricated. The semiconductor material making up the semiconductor 10 can be any semiconductor material such as silicon, silicon germanium, germanium, a III-V compound semiconductor, or a II-VI compound semiconductor. The present invention has applicability to both silicon-on-insulator (SOI) and bulk semiconductor technology. Deposited on semiconductor 10 is a high k dielectric layer 16 of a material such as hafnium oxide ($HfO_2$), zirconium oxide ($ZrO_2$), aluminum oxide ($Al_2O_3$), hafnium silicon oxide ($HfSi_xO_y$), and any other dielectric material having a dielectric constant higher than that of silicon dioxide ($SiO_2$; dielectric constant 3.9). The high k layer 16 should have an approximate thickness of about 10 to 50 angstroms. The metal gate layer 18 is then deposited on the high k layer 16. The metal gate layer 18 may be made from a material such as titanium nitride (TiN), tantalum silicon nitride (TaSiN), tungsten (W), hafnium nitride (HfN), tantalum nitride (TaN) and aluminum (Al). The metal gate layer 18 should have an approximate thickness of about 10 to 200 angstroms. Next, a first silicon layer 20 having an approximate thickness of about 100 to 500 angstroms is deposited over the metal gate layer 18. Finally, a hardmask layer 22 having an approximate thickness of 10 to 50 angstroms is deposited over the first silicon layer 20. The hardmask layer 22 may be made from a material such as silicon nitride ($Si_3N_5$) or silicon dioxide ($SiO_2$).

Figure 2:
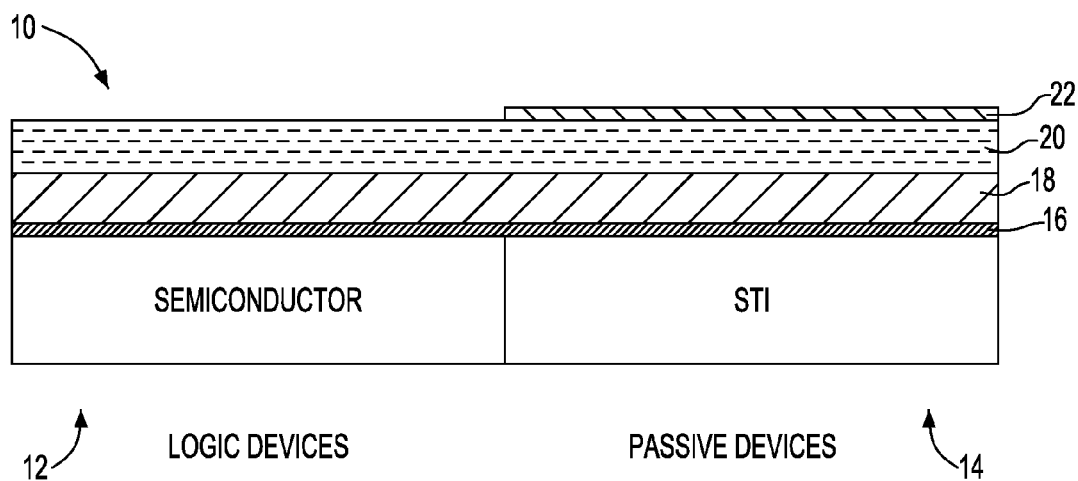

Referring now to FIG. 2, the hardmask 22 over the logic region 12 is conventionally removed by reactive ion etching or a wet etch.

Figure 3:
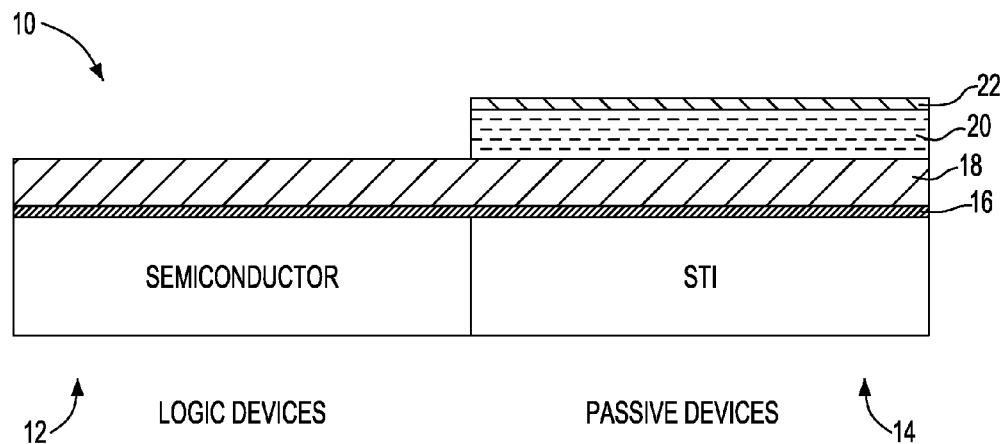

Referring now to FIG. 3, the first silicon layer 20 is conventionally removed from the logic region 12 by wet etching.

Figure 4:
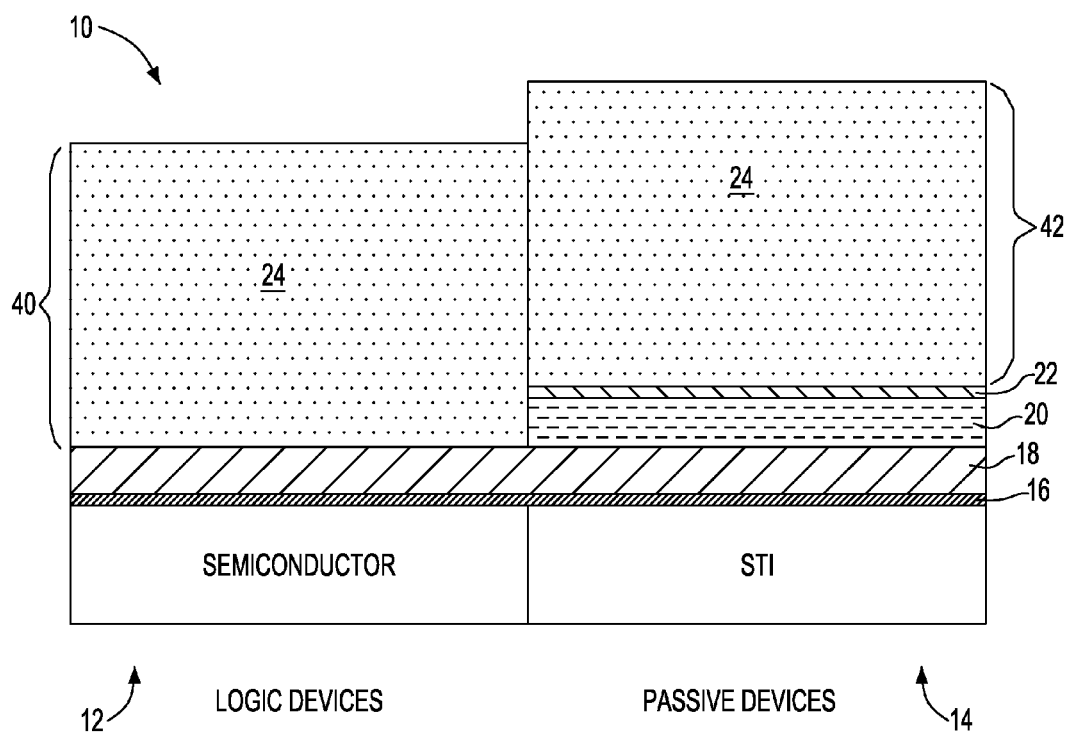

Referring now to FIG. 4, second silicon layer 24 has been applied to both the logic region 12 and STI region 14. Thus, the logic region 12 includes a stack of high k layer 16, metal gate layer 18 and second silicon layer 24 while the STI region 14 includes a stack of high k layer 16, metal gate layer 18, first silicon layer 20, hardmask layer 22 and second silicon layer 24. The hardmask layer 22 in the STI region 14 forms an insulating layer between the metal gate layer 18 and second silicon layer 24. The semiconductor 10 has been achieved with a robust layer of second silicon 24 on the STI region 14.

In this embodiment, the effective silicon layer thickness 42 on the passive device is the same as the silicon layer thickness 40 on the logic device.

According to the processing described above, a semiconductor structure 10 has been fabricated comprising a semiconductor substrate having a logic region 12 and an STI region 14, the logic region 12 having a layer of high dielectric constant (high K) material 16, a metal gate layer 18 and a silicon layer 24 and the STI region 14 having a layer of high K material 16, a metal gate layer 18, a first silicon layer 20, a hard mask layer 22 and a second silicon layer 24. The silicon layer 24 in the logic region 12 has a first thickness 40 and the second silicon layer in the STI region has a second thickness 42 wherein the first thickness 40 equals the second thickness 42.

Figure 5:
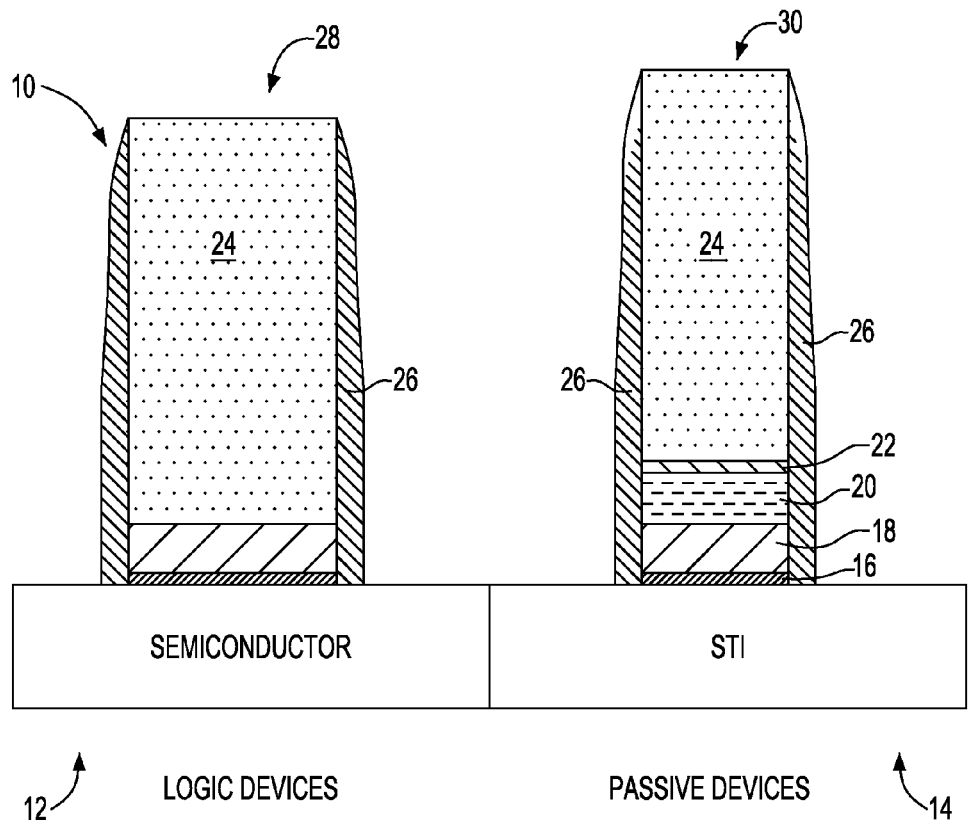

Referring now to FIG. 5, the semiconductor 10 undergoes an etching step such as reactive ion etching to etch each of the stacks of layers over the logic region 12 and STI region 14 to result in narrower stacks of layers to form a logic device 28 in logic region 12 and a passive device 30, such as a resistor or e-fuse, in the STI region 14. Thereafter, nitride spacers 26 are added to each of the logic device 28 and passive device 30.

Further conventional processing (not shown) may then occur with respect to the semiconductor 10. An oxide spacer may also be added. Subsequently, halos, extensions, source/drain regions and silicidation may occur as is conventional. An oxide layer may then be deposited over the logic device 28 and passive device 30. Standard wafer processing may continue with formation of contact via metallurgy, back end of the line (BEOL) wiring, interlevel dielectrics and interconnects.

Figure 6:
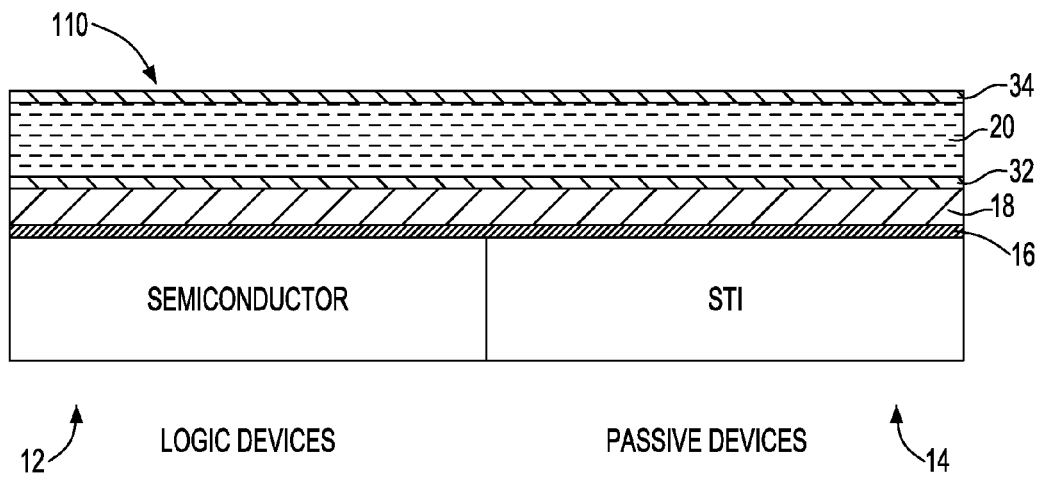
FIGS. 6 to 8 illustrate a method of fabrication and a structure of a second embodiment of a HKMG semiconductor according to the present invention having improved silicon thickness on the passive device.
Figure 7:
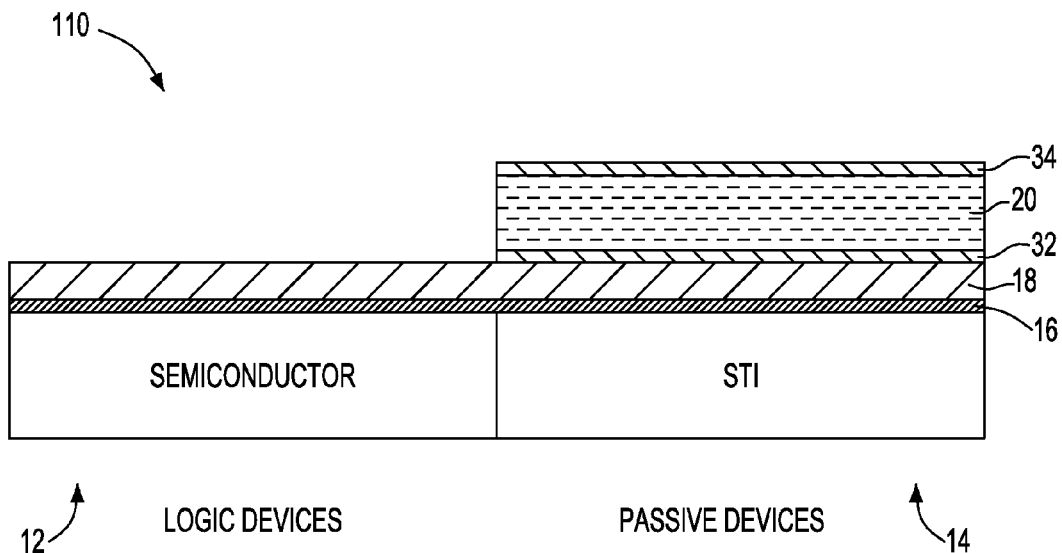
Figure 8:
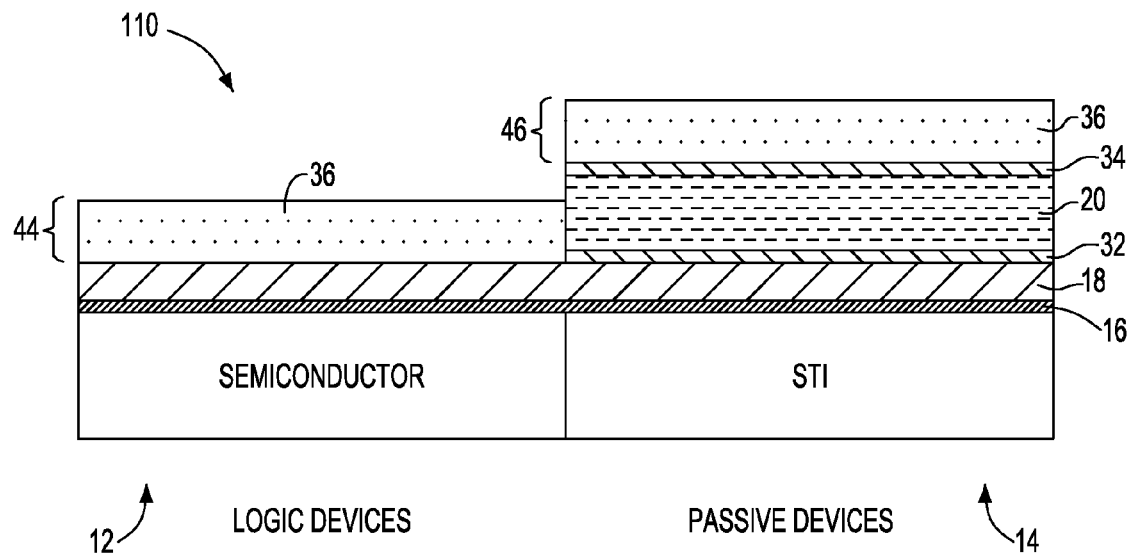

Referring now to FIGS. 6 to 8, there is shown a method of fabrication and a structure of a second embodiment of a HKMG semiconductor according to the present invention having improved silicon thickness on the passive device. As shown first in FIG. 6, there is a partially fabricated semiconductor 110 having a logic region 12 and an STI region 14. Layered over the semiconductor 10 is a high k dielectric layer 16 and metal gate layer 18 which could be the same materials and the same thicknesses as in the first embodiment discussed above with respect to FIGS. 1 to 5. In this second embodiment of the present invention, there is a first hard mask layer 32, a first silicon layer 20 and a second hardmask layer 34. The first hardmask layer 32 and second hardmask layer 34 could be made of the same materials, for example, silicon nitride or silicon dioxide. The thickness of the first hardmask layer 32 is not critical but the thickness of the second hardmask layer 34 should be about 10 to 50 angstroms.

Referring to FIG. 7, the first hardmask layer 32, first silicon layer 20 and second hardmask layer 34 are removed in the logic region 12 by conventional etching techniques.

Referring to FIG. 8, second silicon layer 36 is deposited over the logic region 12 and STI region 14. The thickness of second silicon layer 36 is about 250 to 300 angstroms with the thickness being determined by the logic device requirement. Thus, the logic region 12 includes a stack of high k layer 16, metal gate layer 18 and second silicon layer 36 while the STI region 14 includes a stack of high k layer 16, metal gate layer 18, first hardmask layer 32, first silicon layer 20, hardmask layer 34 and second silicon layer 36. The hardmask layer 34 in the STI region 14 forms an insulating layer between the metal gate layer 18 and second silicon layer 36. The semiconductor 110 has been achieved with a robust layer of second silicon 36 on the STI region 14. In this embodiment, the effective silicon layer thickness 46 on the passive device is the same as the silicon layer thickness 44 on the logic device while the total thickness of the silicon in the STI region 14

(first silicon layer 20 plus second silicon layer 36) is greater than the thickness of the second silicon layer 36 alone on the logic region 12.

According to the processing described above, a semiconductor structure 110 has been fabricated comprising a semiconductor substrate having a logic region 12 and an STI region 14, the logic region 12 having a layer of high dielectric constant (high K) material 16, a metal gate layer 18 and a silicon layer 36 and the STI region 14 having a layer of high K material 16, a metal gate layer 18, a first hardmask layer 32, a first silicon layer 20, a second hardmask layer 34 and a second silicon layer 36. The silicon layer 36 in the logic region 12 has a first thickness 44 and the second silicon layer in the STI region has a second thickness 46 wherein the first thickness 44 equals the second thickness 46.

The processing then continues as described above with respect to the first embodiment of the invention. It should be noted that second hardmask layer 34 should be thin enough so that the subsequent silicidation process can punch through the second hardmask layer 34 and make the passive device functional. The thickness of the first silicon layer 20 helps to improve the passive device uniformity wherein the final passive device includes both first silicon layer 20 and second silicon layer 36, whose total thickness is greater than that of second silicon layer 36 in the logic device. In this way, the passive device uniformity is improved with the adjustable thickness of first silicon layer 20.

Figure 9:
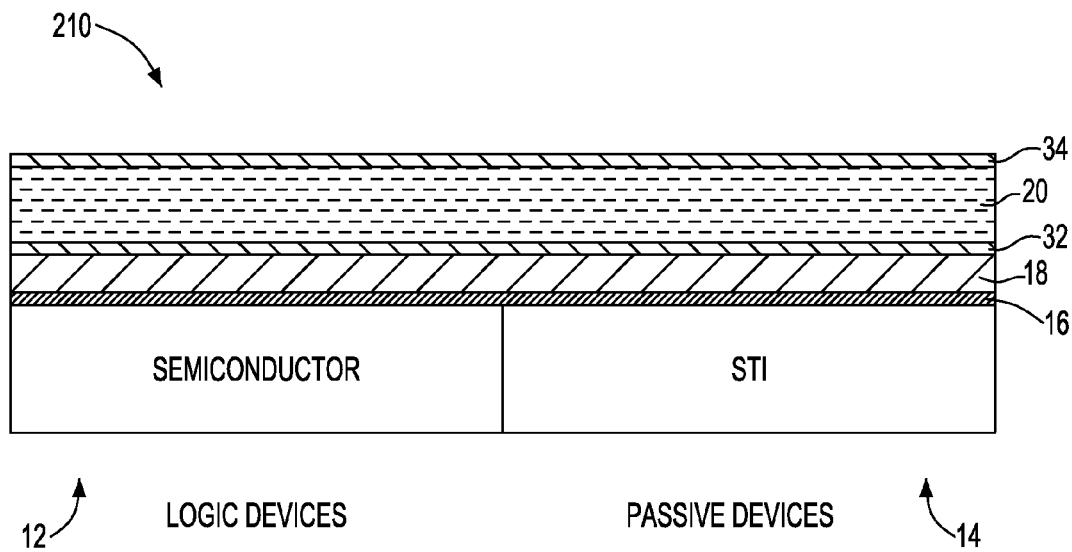
FIGS. 9 to 12 illustrate a method of fabrication and a structure of a third embodiment of a HKMG semiconductor according to the present invention having improved silicon thickness on the passive device.

Referring now to FIGS. 9 to 12, there is shown a third embodiment of the present invention. FIG. 9 shows a partially fabricated semiconductor 210. The various layers, high dielectric constant layer 16, metal gate layer 18, first hardmask layer 32, first silicon layer 20, and second hardmask layer 34, are identical to those shown in FIG. 6 for the second embodiment of the invention.

Figure 10:
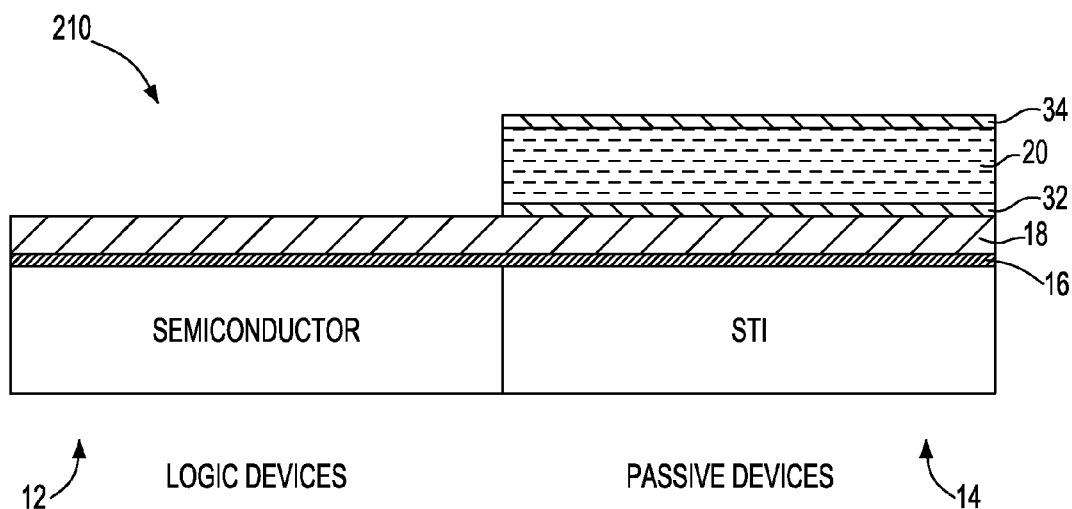

Referring now to FIG. 10, the first hardmask layer 32, first silicon layer 20 and second hardmask layer 34 are removed in the logic region 12 by conventional etching techniques.

Figure 11:
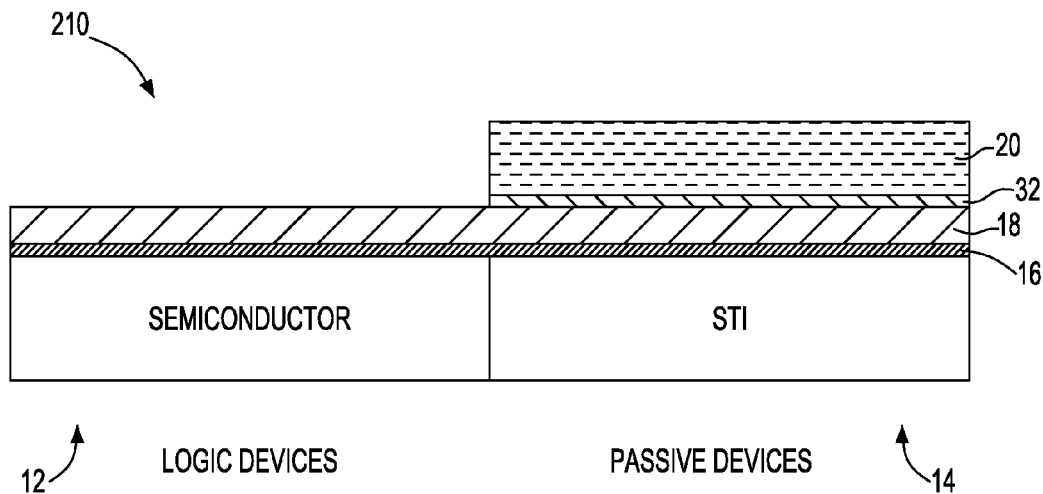

Referring now to FIG. 11, the second hardmask layer 34 is removed from the STI region 14.

Figure 12:
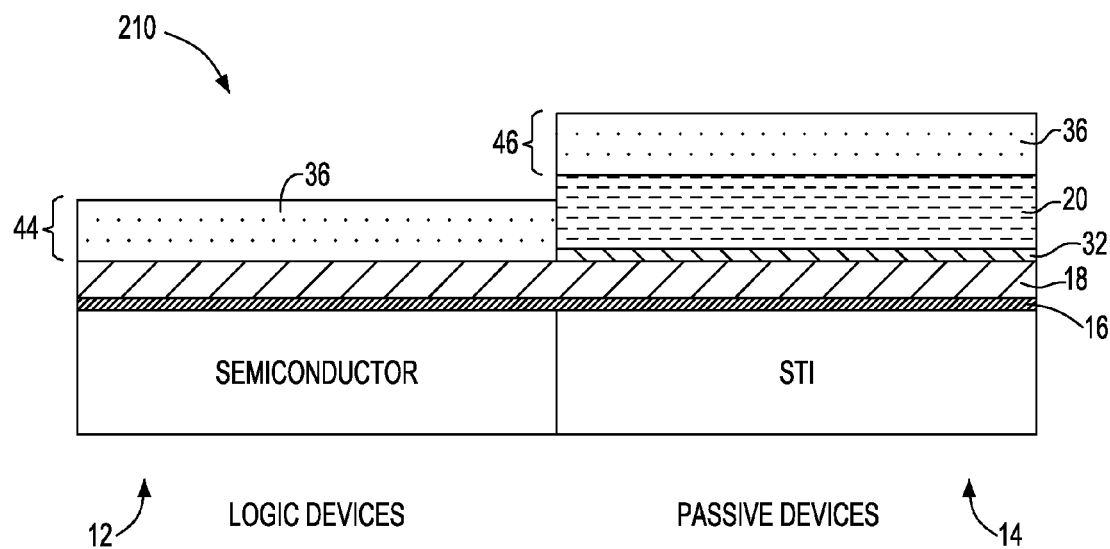

Referring now to FIG. 12, second silicon layer 36 is deposited over the logic region 12 and STI region 14. The thickness of second silicon layer 36 is about 250 to 300 angstroms with the thickness being determined by the logic device requirement. Thus, the logic region 12 includes a stack of high k layer 16, metal gate layer 18 and second silicon layer 36 while the STI region 14 includes a stack of high k layer 16, metal gate layer 18, first hardmask layer 32, first silicon layer 20 and second silicon layer 36. The semiconductor 210 has been achieved with a robust layer of second silicon 36 on the STI region 14. In this embodiment, the effective silicon layer thickness on the passive device is thicker than that on the logic device.

According to the processing described above, a semiconductor structure 210 has been fabricated comprising a semiconductor substrate having a logic region 12 and an STI region 14, the logic region 12 having a layer of high dielectric constant (high K) material 16, a metal gate layer 18 and a silicon layer 36 and the STI region 14 having a layer of high K material 16, a metal gate layer 18, a first hardmask layer 32, a first silicon layer 20 and a second silicon layer 36. The silicon layer 36 in the logic region 12 has a first thickness 44 and the second silicon layer in the STI region has a second thickness 46 wherein the first thickness 44 equals the second thickness 46 although it should be understood that the effective silicon thickness in the STI region includes the thickness of both first silicon layer 20 and second silicon layer 36.

The processing then continues as described above with respect to the first embodiment of the invention.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. A method of forming a semiconductor device comprising the steps of:
    obtaining a semiconductor substrate having a logic region and a shallow trench isolation (STI) region;
    sequentially depositing layers of a high dielectric constant (high K) material, a metal gate, a first silicon and a hardmask on the semiconductor substrate to form a semiconductor substrate having layers of high dielectric constant (high K) material, metal gate, first silicon and hardmask;
    removing the hardmask and first silicon layers from the logic region of the semiconductor substrate to result in a semiconductor substrate having a logic region having layers of high K material and metal gate and an STI region having layers of high K material, metal gate, first silicon and a hardmask; and
    applying a second layer of silicon on the semiconductor substrate such that the logic region comprises layers of high K material, metal gate and second silicon and the STI region comprises layers of high K material, metal gate, first silicon, hardmask and second silicon.

2. The method of claim 1 wherein the step of sequentially depositing layers further comprises depositing a first hardmask layer on the metal gate layer before depositing the first silicon layer, the step of removing further comprises removing the first hardmask layer from the logic region and after the step of applying, the logic region comprises layers of high K material, metal gate and second silicon and the STI region comprises layers of high K material, metal gate, first hardmask, first silicon, hardmask and second silicon.

3. The method of claim 1 wherein the step of sequentially depositing layers further comprises depositing a first hardmask layer on the metal gate layer before depositing the first silicon layer, the step of removing further comprises removing the first hardmask layer from the logic region, after the step of removing, further comprising the step of removing the second hardmask layer from the STI region, and after the step of applying, the logic region comprises layers of high K material, metal gate and second silicon and the STI region comprises layers of high K material, metal gate, first hardmask, first silicon, and second silicon.

4. The method of claim 1 further comprising the steps of partially removing the layers from the logic region and STI region to result in a narrowed stack of layers of high K material, metal gate and second silicon in the logic region and a narrowed stack of layers of high K material, metal gate, first silicon, hardmask and second silicon in the STI region, applying side spacers to the stacks in the logic region and STI region and siliciding the second silicon.

5. The method of claim 2 further comprising the steps of partially removing the layers from the logic region and STI region to result in a narrowed stack of layers of high K material, metal gate and second silicon in the logic region and a narrowed stack of layers of high K material, metal gate, first hardmask, first silicon, hardmask and second silicon in the STI region, applying side spacers to the stacks in the logic region and STI region and siliciding the second silicon.

6. The method of claim 3 further comprising the steps of partially removing the layers from the logic region and STI region to result in a narrowed stack of layers of high K material, metal gate and second silicon in the logic region and a narrowed stack of layers of high K material, metal gate, first hardmask, first silicon and second silicon in the STI region, applying side spacers to the stacks in the logic region and STI region and siliciding the second silicon.

7. The method of claim 1 wherein the metal gate layer is a material selected from the group of materials consisting of titanium nitride (TiN), tantalum silicon nitride (TaSiN), tungsten (W), hafnium nitride (HfN), tantalum nitride (TaN) and aluminum (Al).

8. The method of claim 1 wherein the high K material is selected from the group of materials selected from the group consisting of hafnium oxide ($HfO_2$), zirconium oxide ($ZrO_2$), aluminum oxide ($Al_2O_3$), hafnium silicon oxide ($HfSi_xO_y$), and any other dielectric material having a dielectric constant higher than that of silicon dioxide ($SiO_2$; dielectric constant 3.9).

9. A method of forming a semiconductor device comprising the steps of:
   obtaining a semiconductor substrate having a logic region and a shallow trench isolation (STI) region;
   sequentially depositing layers of a high dielectric constant (high K) material, a metal gate, a first hardmask, a first silicon and a second hardmask on the semiconductor substrate to form a semiconductor substrate having layers of high dielectric constant (high K) material, metal gate, first hardmask, first silicon and second hardmask;
   removing the second hardmask, first silicon and first hardmask layers from the logic region of the semiconductor substrate to result in a semiconductor substrate having a logic region having layers of high K material and metal gate and an STI region having layers of high K material, metal gate, first hardmask, first silicon and second hardmask; and
   applying a second layer of silicon on the semiconductor substrate such that the logic region comprises layers of high K material, metal gate and second silicon and the STI region comprises layers of high K material, metal gate, first hardmask, first silicon, second hardmask and second silicon.

10. The method of claim 9 wherein after the step of removing, further comprising the step of removing the second hardmask layer from the STI region and after the step of applying, the logic region comprises layers of high K material, metal gate and second silicon and the STI region comprises layers of high K material, metal gate, first hardmask, first silicon and second silicon.

11. The method of claim 9 further comprising the steps of partially removing the layers from the logic region and STI region to result in a narrowed stack of layers of high K material, metal gate and second silicon in the logic region and a narrowed stack of layers of high K material, metal gate, first hardmask, first silicon, second hardmask and second silicon in the STI region, applying side spacers to the stacks in the logic region and STI region and siliciding the second silicon.

12. The method of claim 10 further comprising the steps of partially removing the layers from the logic region and STI region to result in a narrowed stack of layers of high K material, metal gate and second silicon in the logic region and a narrowed stack of layers of high K material, metal gate, first hardmask, first silicon, and second silicon in the STI region, applying side spacers to the stacks in the logic region and STI region and siliciding the second silicon.

13. The method of claim 9 wherein the metal gate layer is a material selected from the group of materials consisting of titanium nitride (TiN), tantalum silicon nitride (TaSiN), tungsten (W), hafnium nitride (HfN), tantalum nitride (TaN) and aluminum (Al).

14. The method of claim 9 wherein the high K material is selected from the group of materials consisting of hafnium oxide ($HfO_2$), zirconium oxide ($ZrO_2$), aluminum oxide ($Al_2O_3$), hafnium silicon oxide ($HfSi_xO_y$), and any other dielectric material having a dielectric constant higher than that of silicon dioxide ($SiO_2$; dielectric constant 3.9).

15. A semiconductor structure comprising:
   a semiconductor substrate having a logic region and a shallow trench isolation (STI) region;
   the logic region having, in the following order, a layer of high dielectric constant (high K) material, a metal gate layer and a silicon layer;
   the STI region having, in the following order, a layer of high K material, a metal gate layer, a first silicon layer, a hard mask layer and a second silicon layer;
   wherein the silicon layer in the logic region has a first thickness and the second silicon layer in the STI region has a second thickness wherein the first thickness equals the second thickness.

16. The semiconductor structure of claim 15 wherein the STI region further includes a second hard mask layer between the metal gate layer and the first silicon layer.

17. The semiconductor structure of claim 15 wherein the metal gate layer is a material selected from the group of materials consisting of titanium nitride (TiN), tantalum silicon nitride (TaSiN), tungsten (W), hafnium nitride (HfN), tantalum nitride (TaN) and aluminum (Al).

18. The semiconductor structure of claim 15 wherein the high K material is selected from the group of materials consisting of hafnium oxide ($HfO_2$), zirconium oxide ($ZrO_2$), aluminum oxide ($Al_2O_3$), hafnium silicon oxide ($HfSi_xO_y$), and any other dielectric material having a dielectric constant higher than that of silicon dioxide ($SiO_2$; dielectric constant 3.9).

19. The semiconductor structure of claim 15 further comprising side spacers applied to sides of the layers in the logic region and STI region and wherein the second silicon layer in the logic region and STI region is silicided.

20. A semiconductor structure comprising:
   a semiconductor substrate having a logic region and a shallow trench isolation (STI) region;
   the logic region having, in the following order, a layer of high dielectric constant (high K) material, a metal gate layer and a silicon layer;
   the STI region having, in the following order, a layer of high K material, a metal gate layer, a first hardmask layer, a first silicon layer, and a second silicon layer;
   wherein the silicon layer in the logic region has a first thickness and the second silicon layer in the STI region has a second thickness wherein the first thickness equals the second thickness.

21. The semiconductor structure of claim 20 further comprising a second hardmask layer between the first silicon layer and the second silicon layer.

22. The semiconductor structure of claim 20 wherein the metal gate layer is a material selected from the group of materials consisting of titanium nitride (TiN), tantalum silicon nitride (TaSiN), tungsten (W), hafnium nitride (HfN), tantalum nitride (TaN) and aluminum (Al).

23. The semiconductor structure of claim 20 wherein the high K material is selected from the group of materials consisting of hafnium oxide ($HfO_2$), zirconium oxide ($ZrO_2$), aluminum oxide ($Al_2O_3$), hafnium silicon oxide ($HfSi_xO_y$), and any other dielectric material having a dielectric constant higher than that of silicon dioxide ($SiO_2$; dielectric constant 3.9).

24. The semiconductor structure of claim 20 further comprising side spacers applied to sides of the layers in the logic region and STI region and wherein the second silicon layer in the logic region and STI region is silicided.

25. The semiconductor structure of claim 21 further comprising side spacers applied to sides of the layers in the logic region and STI region and wherein the second silicon layer in the logic region and STI region is silicided.

* * * * *